United States Patent
Bosco et al.

(10) Patent No.: US 7,561,022 B2
(45) Date of Patent: *Jul. 14, 2009

(54) SYSTEM AND METHOD FOR VALIDATING RADIO FREQUENCY IDENTIFICATION TAGS

(75) Inventors: Edward Michael Bosco, Claysville, PA (US); William G. Gunther, Guilford, CT (US); Roman Golicz, Clinton, CT (US); Stefan G. Golicz, Saybrook, CT (US)

(73) Assignee: George Schmitt & Company, Inc., Guilford, CT (US)

( * ) Notice: Subject to any disclaimer, the term of this patent is extended or adjusted under 35 U.S.C. 154(b) by 1209 days.

This patent is subject to a terminal disclaimer.

(21) Appl. No.: 10/947,752

(22) Filed: Sep. 23, 2004

(65) Prior Publication Data

US 2005/0150102 A1   Jul. 14, 2005

Related U.S. Application Data

(60) Provisional application No. 60/536,097, filed on Jan. 13, 2004, provisional application No. 60/591,397, filed on Jul. 27, 2004.

(51) Int. Cl.
*H04Q 5/22* (2006.01)
(52) U.S. Cl. .................. 340/10.1; 340/10.5; 340/572.1; 340/572.7; 340/572.8
(58) Field of Classification Search ............. 340/572.1, 340/572.4, 572.7, 572.8, 10.1, 10.5, 10.51
See application file for complete search history.

(56) References Cited

U.S. PATENT DOCUMENTS

| | | | |
|---|---|---|---|
| 6,236,223 B1 | 5/2001 | Brady et al. | 324/765 |
| 6,639,509 B1 | 10/2003 | Martinez | 340/10.4 |
| 7,245,227 B2 * | 7/2007 | Winter et al. | 340/686.2 |
| 7,420,457 B2 * | 9/2008 | Bode et al. | 340/10.1 |
| 2005/0110641 A1 | 5/2005 | Mendolia et al. | 340/572.1 |
| 2005/0140457 A1 | 6/2005 | Bellantoni | 332/106 |
| 2005/0150102 A1 | 7/2005 | Bosco et al. | 29/593 |
| 2005/0156039 A1 | 7/2005 | Carrender et al. | 235/439 |
| 2005/0159913 A1 | 7/2005 | Ariyoshi et al. | 702/122 |

OTHER PUBLICATIONS

International Search Report, Mar. 22, 2007, 6 pages.

* cited by examiner

*Primary Examiner*—Toan N. Pham
*Assistant Examiner*—Travis R Hunnings
(74) *Attorney, Agent, or Firm*—St. Onge Steward Johnston & Reens LLC

(57) ABSTRACT

A system for validating each of a plurality of radio frequency identification tags disposed on a web in close proximity to one another to ensure proper functioning thereof includes a narrow angle radio frequency identification tag reading station which reads a designation of each radio frequency identification tag individually in order to generate a first list of tag designations read thereby and a wide angle radio frequency identification tag reading station which reads designations of a plurality of radio frequency identification tags simultaneously from a long range in order to generate a second list of tag designations read thereby. The system also includes a processor which compares the first list of tag designations with the second list of tag designations and evaluates the functionality of the plurality of radio frequency identification tags based at least in part upon the comparison.

46 Claims, 4 Drawing Sheets

SYSTEM AND METHOD FOR VALIDATING RADIO FREQUENCY IDENTIFICATION TAGS

RELATED APPLICATIONS

This patent application claims the benefit of, under Title 35, United States Code, Section 119(e), U.S. Provisional Patent Application No. 60/536,097, filed Jan. 13, 2004 and U.S. Provisional Patent Application No. 60/591,397, filed Jul. 27, 2004.

FIELD OF THE INVENTION

The present invention relates generally to radio frequency identification tags, used for example in connection with warehousing, inventory management and product tracking, and more particularly to systems and methods for validating such radio frequency identification tags to ensure proper functioning thereof.

BACKGROUND OF THE INVENTION

Radio frequency identification (RFID) is a technology which is rapidly gaining acceptance in a variety of fields including warehousing, inventory management, and product tracking. It is based on a system which is comprised of a reader (e.g., a radio transmitter/receiver with antennae), a tag (comprised of a miniature antenna with a silicone chip attached thereto), and a processor which captures information received from individual tags. Each silicone chip is programmed with a unique electronic product code (EPC), and in many instances tags are covertly attached to or packaged with products, for example via a blank or printed label or by some other means.

Readers generally operate at three different frequencies: low, high, and ultra high (ultrahigh being generally recognized as being from 300 to 900 MHz). The read range of a tag is a function of the frequency and size of the tag antenna, because tags are passive and are only energized when they are in the field of the radio waves transmitted by the reader. The ultra high frequency (e.g., 900 MHz) tags are becoming the tag of choice for most inventory control applications because of their relatively long read range (e.g., up to 14 feet in typical situations, and up to 30 meters in some applications).

Ordinary labels are relatively inexpensive to produce (e.g., less than a penny each), as compared to the cost of producing an RFID tag (e.g., $0.20 to $1.00 or more each), even before it is applied to a printed label. For this reason, RFID labeling has been generally restricted to the shipping carton or skid level. However, now there are powerful forces which are mandating RFID tagging at the item level for some products. Various governmental agencies, such as Congress, the Department of Defense and the FDA are pressuring parties, such as suppliers and pharmaceutical companies, to create better inventory control of certain goods, materials, and prescription drugs, and to implement more effective product authentication through overt and covert security features. In addition, Wal-Mart® has dictated to its major suppliers that they will support RFID within the very near future.

Currently, RFID tag manufacturers are not able to guarantee that all tag inlays that they ship are readable, functional tags—in fact, as many as 20% of the incoming tags may be non-readable. However, for many applications, label printers must be able to ensure that 100% (or at least very close to 100%) of the RFID labels are readable. This means that all RFID labels need to be read and verified when they are in their finished state, i.e. mounted in close proximity to one and another (e.g., inches apart) in a continuous web of paper which is then coiled into a roll of labels. Reader/verification equipment exists that at slow speed can read labels which are close together with a very short read range. Similarly, reader/verification equipment exists that can read RFID labels which have a longer read range (e.g., several feet), but the labels have to be far apart. The difficulty is in discriminating between labels that have a long read range, but that are spaced closely together. There is no known commercially available system which will effectively guarantee that substantially 100% of the ultra high frequency (e.g., 900 MHz) tags mounted in a roll at close proximity (e.g., a few inches apart) and that have a long read range (e.g., greater than 24") are all functional tags, while being processed at normal production speeds (e.g., several hundred labels per minute).

What is desired, therefore, is a system and method for validating radio frequency identification tags to ensure proper functioning thereof which is capable of ensuring that 100% (or at least very close to 100%) of the RFID labels are readable, which is capable of reading and verifying RFID labels when they are in their finished state, i.e. mounted in close proximity to one and another (e.g., inches apart) on a liner or carrier (for example a continuous web of paper of the like), which is adapted to be used in conjunction with tags having a long read range (e.g., greater than 24"), and which is capable of reading and validating labels moving at a relatively fast speed.

SUMMARY OF THE INVENTION

Accordingly, it is an object of the present invention to provide a system and method for validating radio frequency identification tags to ensure proper functioning thereof which is capable of ensuring that 100% (or at least very close to 100%) of the RFID labels are readable.

Another object of the present invention is to provide a system and method for validating radio frequency identification tags to ensure proper functioning thereof having the above characteristics and which is capable of reading and verifying RFID labels when they are in their finished state, i.e. mounted in close proximity to one and another (e.g., inches apart) on a liner or carrier (for example a continuous web of paper of the like).

A further object of the present invention is to provide a system and method for validating radio frequency identification tags to ensure proper functioning thereof having the above characteristics and which is adapted to be used in conjunction with tags having a long read range (e.g., greater than 24").

Still another object of the present invention is to provide a system and method for validating radio frequency identification tags to ensure proper functioning thereof having the above characteristics and which is capable of reading and validating labels moving at a relatively fast speed.

These and other objects are achieved according to one embodiment of the present invention by provision of a system for validating each of a plurality of radio frequency identification tags disposed on a web in close proximity to one another to ensure proper functioning thereof, the system including a narrow angle radio frequency identification tag reading station which reads a designation of each radio frequency identification tag individually in order to generate a first list of tag designations read thereby, and a wide angle radio frequency identification tag reading station which reads designations of a plurality of radio frequency identification tags simultaneously from a long range in order to generate a second list of tag designations read thereby. The system also includes a processor which compares the first list of tag designations with the second list of tag designations and evaluates the functionality of the plurality of radio frequency identification tags based at least in part upon the comparison.

In some embodiments, the narrow angle radio frequency identification tag reading station comprises a shielding structure of conductive material which is built as a waveguide to structure and contain illumination of radio frequency energy so only a single tag is energized and actuated at a time. In certain embodiments, the narrow angle radio frequency identification tag reading station further comprises a transmitting antenna for introducing radio frequency energy into the waveguide. In certain of these embodiments, the transmitting antenna comprises a quarter wavelength long, unity gain, stub antenna. In certain of these embodiments, the length of the transmitting antenna is calculated to be resonant to an average frequency of a range used. In certain embodiments, the transmitting antenna comprises a thick stub antenna so as to spread out the selectivity of the antenna to accommodate the range of frequencies and wavelengths used. In certain of these embodiments, the transmitting antenna has a thickness of about ⅛ inch. In certain of these embodiments, a length of the transmitting antenna is calculated to be resonant to an average frequency of a range used less about 5%. In some embodiments, the transmitting antenna is disposed parallel to a dipole antenna of the radio frequency identification tags.

In some embodiments, the narrow angle radio frequency identification tag reading station further comprises a receiving antenna which receives signals transmitted by the transmitting antenna. In certain of these embodiments, the receiving antenna further absorbs unused radio frequency illumination, thereby suppressing reflections back up the waveguide. In certain embodiments, the receiving antenna comprises a quarter wavelength long, unity gain, stub antenna. In certain of these embodiments, the length of the receiving antenna is calculated to be resonant to an average frequency of a range used. In certain embodiments, the receiving antenna comprises a thick stub antenna so as to spread out the selectivity of the antenna to accommodate the range of frequencies and wavelengths used. In certain of these embodiments, the receiving antenna has a thickness of about ⅛ inch. In certain of these embodiments, a length of the receiving antenna is calculated to be resonant to an average frequency of a range used less about 5%. In some embodiments, the receiving antenna is disposed parallel to a dipole antenna of the radio frequency identification tags.

In some embodiments, the narrow angle radio frequency identification tag reading station further comprises electrically conductive tunnels provided at an entrance and an exit for the web of radio frequency identification tags, which tunnels act to suppress and absorb any radio frequency energy that leaks into or is reflected into the tunnels. In certain of these embodiments, the tunnels are slideable toward and away from each other into the waveguide in order to vary dimensions of an opening therebetween masking off adjacent radio frequency identification tags on the web so as to accommodate tags having various spacings on the web. In certain embodiments, the system further includes an electrically conducting slide having a slot introduced into the waveguide, the slot being transparent to the radio waves and transversally overlaying the web of radio frequency identification tags.

In some embodiments, the narrow angle radio frequency identification tag reading station comprises an optical machine vision reading station and each tag has associated therewith a machine vision readable indication of that tag's designation. In certain of these embodiments, the machine vision readable indication is printed on a backing or carrier layer on which each tag is carried or is attached to.

In some embodiments, the wide angle radio frequency identification tag reading station reads tags from a distance at least as far as the tags are to be used in practice. In certain of these embodiments, the wide angle radio frequency identification tag reading station reads tags from a distance of at least 24 inches.

In accordance with another embodiment of the present invention, a system for validating each of a plurality of radio frequency identification tags disposed on a web in close proximity to one another to ensure proper functioning thereof, includes a narrow angle radio frequency identification tag reading station which reads a designation of each radio frequency identification tag individually in order to generate a first list of tag designations read thereby. The radio frequency identification tag reading station includes a shielding structure of conductive material which is built as a waveguide to structure and contain illumination of radio frequency energy so only a single tag is energized and actuated at a time, a transmitting antenna disposed parallel to a dipole antenna of the radio frequency identification tags for introducing radio frequency energy into the waveguide, a receiving antenna which receives signals transmitted by the transmitting antenna, and electrically conductive tunnels provided at an entrance and an exit for the web of radio frequency identification tags, which tunnels act to suppress and absorb any radio frequency energy that leaks into or is reflected into the tunnels. The system also includes a wide angle radio frequency identification tag reading station which reads designations of a plurality of radio frequency identification tags simultaneously from a long range in order to generate a second list of tag designations read thereby, and a processor which compares the first list of tag designations with the second list of tag designations and evaluates the functionality of the plurality of radio frequency identification tags based at least in part upon the comparison.

In some embodiments, the receiving antenna further absorbs unused radio frequency illumination, thereby suppressing reflections back up the waveguide. In some embodiments, the transmitting antenna comprises a quarter wavelength long, unity gain, stub antenna. In certain of these embodiments, a length of the transmitting antenna is calculated to be resonant to an average frequency of a range used. In certain embodiments, the transmitting antenna comprises a thick stub antenna so as to spread out the selectivity of the antenna to accommodate the range of frequencies and wavelengths used. In certain embodiments, the transmitting antenna has a thickness of about ⅛ inch. In certain of these embodiments, a length of the transmitting antenna is calculated to be resonant to an average frequency of a range used less about 5%.

In some embodiments, the receiving antenna comprises a quarter wavelength long, unity gain, stub antenna. In certain of these embodiments, the length of the receiving antenna is calculated to be resonant to an average frequency of a range used. In certain embodiments, the receiving antenna comprises a thick stub antenna so as to spread out the selectivity of the antenna to accommodate the range of frequencies and wavelengths used. In certain of these embodiments, the receiving antenna has a thickness of about ⅛ inch. In certain of these embodiments, a length of the receiving antenna is calculated to be resonant to an average frequency of a range used less about 5%. In some embodiments, the receiving antenna is disposed parallel to a dipole antenna of the radio frequency identification tags.

In some embodiments the tunnels are slideable toward and away from each other into the waveguide in order to vary dimensions of an opening therebetween masking off adjacent radio frequency identification tags on the web so as to accommodate tags having various spacings on the web. In certain embodiments, the system further includes an electrically conducting slide having a slot introduced into the waveguide, the slot being transparent to the radio waves and transversally overlaying the web of radio frequency identification tags. In some embodiments, the wide angle radio frequency identification tag reading station reads tags from a distance at least as far as the tags are to be used in practice. In certain of these embodiments, the wide angle radio frequency identification tag reading station reads tags from a distance of at least 24 inches.

In accordance with a further embodiment of the present invention, a system for validating each of a plurality of radio frequency identification tags disposed on a web in close proximity to one another to ensure proper functioning thereof includes a narrow angle radio frequency identification tag reading station which reads a designation of each radio frequency identification tag individually in order to generate a first list of tag designations read thereby. The radio frequency identification tag reading station includes an optical machine vision reading station and wherein each tag has associated therewith a machine vision readable indication of that tag's designation. The system also includes a wide angle radio frequency identification tag reading station which reads designations of a plurality of radio frequency identification tags simultaneously from a long range in order to generate a second list of tag designations read thereby, and a processor which compares the first list of tag designations with the second list of tag designations and evaluates the functionality of the plurality of radio frequency identification tags based at least in part upon the comparison.

In some embodiments, the machine vision readable indication is printed on a backing or carrier layer on which each tag is carried. In some embodiments, the wide angle radio frequency identification tag reading station reads tags from a distance at least as far as the tags are to be used in practice. In certain of these embodiments, the wide angle radio frequency identification tag reading station reads tags from a distance of at least 24 inches.

In accordance with another embodiment of the present invention, a system for validating each of a plurality of radio frequency identification tags disposed on a web in close proximity to one another to ensure proper functioning thereof, the system includes a shielding structure of conductive material which is built as a waveguide to structure and contain illumination of radio frequency energy so only a single tag is energized and actuated at a time, a transmitting antenna disposed parallel to a dipole antenna of the radio frequency identification tags for introducing radio frequency energy into the waveguide, a receiving antenna which receives signals transmitted by the transmitting antenna, and electrically conductive tunnels provided at an entrance and an exit for the web of radio frequency identification tags, which tunnels act to suppress and absorb any radio frequency energy that leaks into or is reflected into the tunnels.

In some embodiments, the receiving antenna further absorbs unused radio frequency illumination, thereby suppressing reflections back up the waveguide. In some embodiments, the transmitting antenna comprises a quarter wavelength long, unity gain, stub antenna. In certain of these embodiments, a length of the transmitting antenna is calculated to be resonant to an average frequency of a range used.

In certain embodiments, the transmitting antenna comprises a thick stub antenna so as to spread out the selectivity of the antenna to accommodate the range of frequencies and wavelengths used. In some embodiments, the transmitting antenna has a thickness of about ⅛ inch. In certain of these embodiments, a length of the transmitting antenna is calculated to be resonant to an average frequency of a range used less about 5%.

In some embodiments, the receiving antenna comprises a quarter wavelength long, unity gain, stub antenna. In certain of these embodiments, the length of the receiving antenna is calculated to be resonant to an average frequency of a range used. In certain embodiments, the receiving antenna comprises a thick stub antenna so as to spread out the selectivity of the antenna to accommodate the range of frequencies and wavelengths used. In certain of these embodiments, the receiving antenna has a thickness of about ⅛ inch. In certain of these embodiments, a length of the receiving antenna is calculated to be resonant to an average frequency of a range used less about 5%. In some embodiments, the receiving antenna is disposed parallel to a dipole antenna of the radio frequency identification tags.

In some embodiments, the tunnels are slideable toward and away from each other into the waveguide in order to vary dimensions of an opening therebetween masking off adjacent radio frequency identification tags on the web so as to accommodate tags having various spacings on the web.

In accordance with another aspect of the invention, a method for validating each of a plurality of radio frequency identification tags disposed on a web in close proximity to one another to ensure proper functioning thereof is provided. The method comprises the steps of: (i) reading a designation of each radio frequency identification tag individually in order to generate a first list of tag designations at a narrow angle radio frequency identification tag reading station; (ii) reading designations of a plurality of radio frequency identification tags simultaneously from a long range in order to generate a second list of tag designations at a wide angle radio frequency identification tag reading station; and (iii) comparing the first list of tag designations with the second list of tag designations and evaluating the functionality of the plurality of radio frequency identification tags based at least in part upon the comparison.

The invention and its particular features and advantages will become more apparent from the following detailed description considered with reference to the accompanying drawings.

DETAILED DESCRIPTION OF EXEMPLARY EMBODIMENTS OF THE INVENTION

As discussed in more detail above, existing systems for reading RFID tags are optimized to read many tags at the same time. These RFID tags have typical rates of failure to read of about 20%. Existing systems do not permit the verification of a single tag, activating the single RFID tag and no others. As an example, the ultra high frequency 900 MHz tags use a spread of frequencies from about 902 MHz through about 928 MHz. The RFID reader produces a transmitted pulse of sufficient power to energize and activate any illuminated RFID tags. The RFID reader then goes into a receive state to receive any transmissions from the activated RFID tags.

However, a problem exists in that adjacent tags on the strip can be energized and activated, making it difficult to know exactly which particular tag of a group of tags is responding. The present invention allows the speedy and automated verification of individual tags when it is not known beforehand that the tag is operational. The known good tags can then be incorporated into more complex products with less scrap/wastage.

Figure 1:
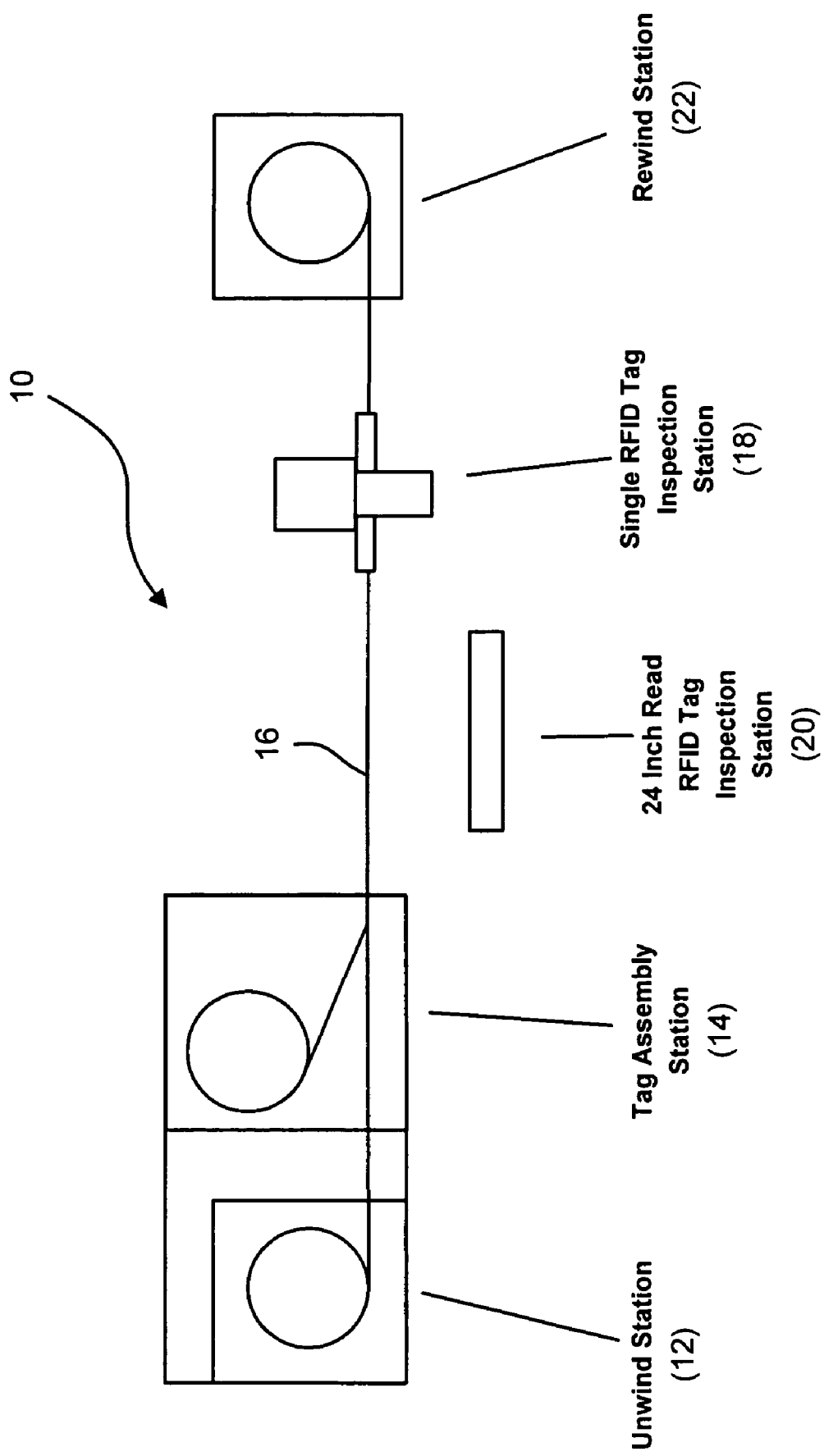
FIG. 1 schematically illustrates a complete system for validating RFID tags in accordance with an embodiment of the present invention, in which a method for discriminating individual RFID tags in accordance with an embodiment of the present invention is embodied.

A complete system 10 for validating RFID tags in accordance with an embodiment of the present invention is shown in FIG. 1. System 10 includes an unwind station 12 where untested RFID tags are loaded, and a tag assembly station 14 where the RFID tags are mated with printed labels. The RFID tag/label combinations are carried through system 10 on a web 16 of carrier material or the like past a narrow angle RFID tag inspection station 18 at which single RFID tags are verified as functional, and past a long range (e.g., 24 inch) tag inspection station 20 at which the tags are verified as readable at a longer distance. After inspection, the 100% verified, assembled tags/labels are wound at a rewind station 22 for packaging and ultimate shipping to a customer. Because unwind stations, tag assembly stations and rewind stations are very well known in the art, and the operation thereof will be known to those skilled in the art, a detailed description of the configuration and operation thereof is not presented herein.

Figure 2:
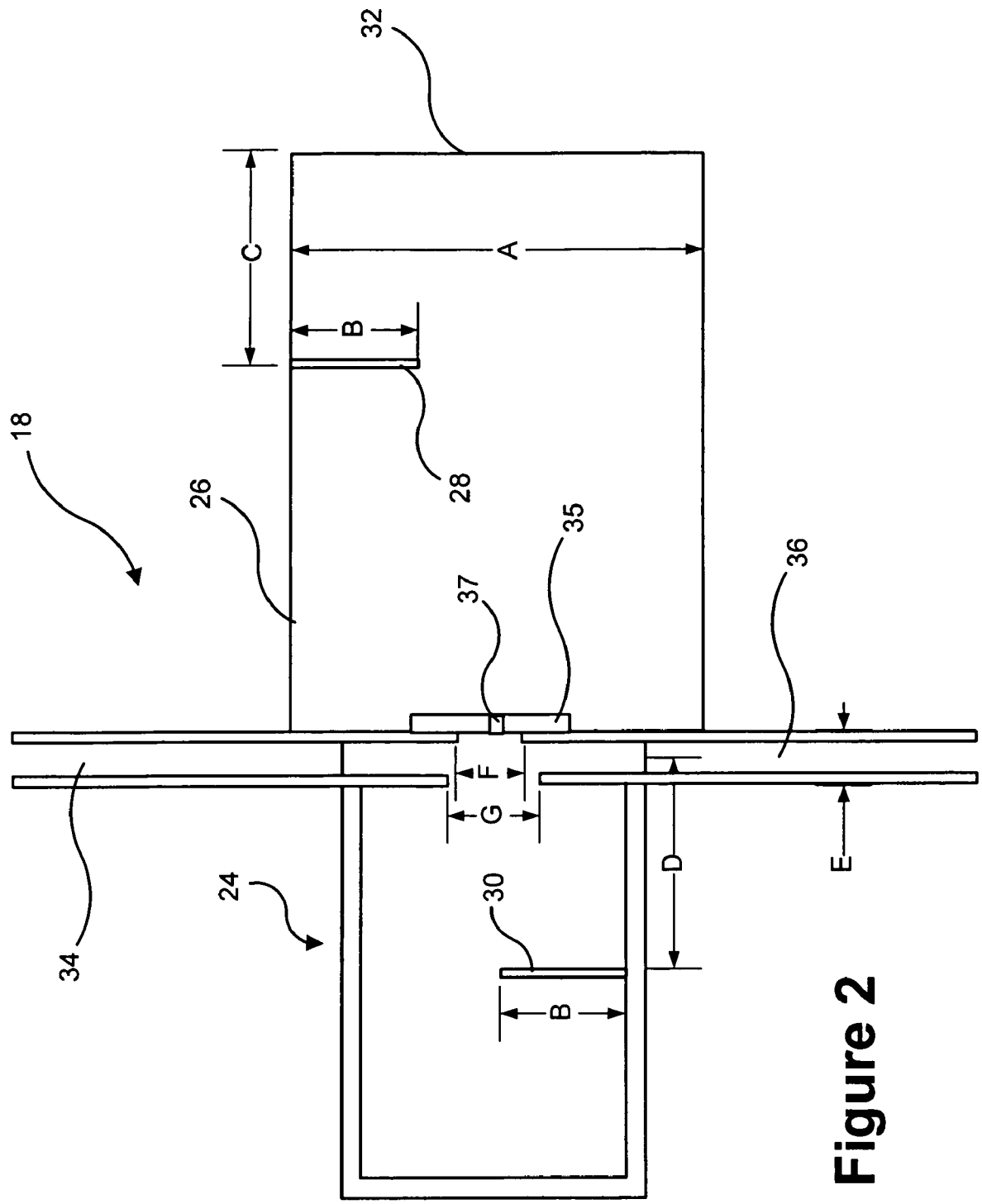
FIG. 2 schematically illustrates in more detail the single RFID inspection station portion of the system shown in FIG. 1, and more particularly details the shielding structure thereof.

Referring now to FIG. 2, the configuration and operation of narrow angle RFID tag inspection station 18 is described in more detail. It should be noted that while the illustrated embodiment is particularly adapted to be used in conjunction with ultra high frequency 900 MHz tags (which employ a spread of frequencies from about 902 MHz through about 928 MHz), the invention may be readily adapted by those skilled in the art for use with other frequencies.

At the heart of narrow angle RFID tag inspection station 18 is a shielding structure 24 of conductive material which is built as a waveguide 26 to structure and contain the illumination of radio frequency (RF) energy so only a single RFID tag is energized and actuated at a time. This shielding structure 24 is electrically tied to earth ground. The dimension marked A on FIG. 2, and parallel to the quarter wavelength stub antennas 28,30, is of particular importance. This dimension determines the frequency response of the waveguide, and in the case of a cylindrical waveguide 26 is approximated by the following relationship: the cutoff wavelength equals 1.706 times the diameter of the cylindrical waveguide. In this example, the dimension A calculates to 9.8 inches nominal (see Table 2). Of course, while the dimension A is of particular importance, it is not necessary that the dimension be 9.8 inches nominal. The particular dimension will be determined by the wavelength to be transmitted.

The waveguide 26 may have any of numerous configurations, although it has been found in the exemplary embodiment discussed herein that configuring the transmitting portion of waveguide 26 as a cylindrical waveguide and configuring the receiving portion of waveguide 26 as a rectangular polyhedral waveguide provides desirable results. In the particular exemplary embodiment discussed herein, the walls of the waveguide are formed from 0.03 inch aluminum and the endplate 32 is formed from 10 inch diameter galvanized steel. All other parts of the waveguide in the exemplary embodiment are formed from ¼ inch polycarbonate covered with aluminum tape or foil.

As mentioned above, narrow angle RFID tag inspection station 18 includes a transmitting stub antenna 28 for introducing RF energy into the waveguide 26. Stub antenna 28 is a quarter wavelength long, unity gain, stub antenna. The length of this transmitting antenna 28 is calculated to be resonant to the average frequency of the range used. A "thick" stub antenna is preferably used to spread out the selectivity (Q) of the antenna to accommodate the range of frequencies and wavelengths used. It has been found that employing an antenna 28 having a thickness of about ⅛ inch provides excellent results with ultra high frequency 900 MHz tags (which employ a spread of frequencies from about 902 MHz through about 928 MHz). Of course, it should be recognized that the ⅛ inch diameter is calculated and selected so as to develop the desired frequency spread at the frequency being used. If a different frequency is used, for example 14.58 MHz or 24.28 GHz, the diameter of the stub antenna would have to be modified. Conversely, if a larger or smaller frequency spread was desired, the diameter of the stub antenna would also have to be modified.

In some embodiments, it is preferable that the length of the stub antenna be reduced in size by about 5%, owing to the increased capacitance when thicker stubs are used to cover the 902 MHz to 928 MHz transmission range in the current example. Thus, while the length B of stub antenna 28 may be 3.23 inches nominal, it has been found that employing a stub antenna 28 having a length B of 3.06 inches provides desirable results (see Table 1).

TABLE 1

Antenna Wavelength Calculations

| Input Frequency | | | FULL Wavelength (meters) | ¼ Wavelength (meters) | ½ Wavelength (meters) |
| --- | --- | --- | --- | --- | --- |
| 902 mHz | Low Range (Hz) | 9.02E+08 | 0.3323 | 0.0830 | 0.1661 |
| 928 mHz | Hi Range (Hz) | 9.28E+08 | 0.3230 | 0.0807 | 0.1615 |
| | | | (inches) | (inches) | (inches) |
| | | | 13.0855 | 3.2713 | 6.5427 |

TABLE 1-continued

Antenna Wavelength Calculations

| | | | FULL Wavelength | ¼ Wavelength | ½ Wavelength |
|---|---|---|---|---|---|
| ¼ Wavelength (Inches) | Per Cent Diff | | 12.7189 | 3.1797 | 6.3594 |
| 3.2713 | 1.4207 | (Low − Avg.)/Avg. * 100% | | | |
| 3.1797 | −1.4207 | (Hi − Avg.)/Avg. * 100% | | | |
| Avg. ¼ Wavelength | | | | | |
| (Inches) | | M shortened | 0.125 | 25.8044 | |
| 3.2255 | | 3.0642 | | 0.95 | M |

The orientation of the transmitting antenna 28 is parallel to the dipole antenna of the RFID tag (the web 16 of which is shown in FIG. 1). The antenna 28 is mounted a distance C of approximately one quarter wavelength from its nearest conductive end 32 of the waveguide 26. In the current example, distance C calculates to approximately 5¼ inches. (see Table 2 for waveguide wavelength calculations).

TABLE 2

Waveguide Wavelength Calculations

| Nominal Frequency (Fo) | 9.02E+08 Hz |
|---|---|
| Nominal Wavelength (Lo) | 0.3323 meters |
| Cutoff Wavelength (Lc) | |
| Lc = 1.706 * diameter | 16.7188 in |
| 9.8 inches | 0.4246 meters |
| | 7.06E+08 Hz |
| Guide Wavelength (Lg) | |
| Lg = 1/SQR((1/Lo)^2 − (1/Lc)^2) | 5.5452 (1/Lc)^2 |
| | 9.0521 (1/Lo)^2 |
| Guide Wavelength = | 0.5340 meters |
| | 21.0236 inches |
| ¼ wavelength = | 5.2559 inches |
| Waveguide Impedance (Zo) | |
| Zo = 377 * (Lg/Lo) | 605.70 Ohms |

As mentioned above, another quarter wavelength long (i.e., having a length B the same as transmitting antenna 28), unity gain, stub antenna 30 is provided. The main purpose of antenna 30 is to act as a receiver antenna, receiving the signals transmitted by the transmitting antenna 28. The orientation of this waveguide terminator antenna 30 is parallel to the transmitting antenna 28, and in some embodiments located on the wall of waveguide 26 opposite to the transmitting antenna 28. The receiving antenna 30 is mounted a distance D approximately one quarter wavelength from a centerline the web of 16 of tags (see FIG. 1 in conjunction with FIG. 2). In the current example, distance D calculates to approximately 5¼ inches. (see Table 2 for waveguide wavelength calculations).

Receiving antenna 30 may also be used as a "dummy load". That is, receiving antenna 30 may also be used as a means for absorbing any unused RF illumination, thereby suppressing any reflections back up the waveguide 26, which reflections could cause unwanted superposition of the RF energy, possibly damaging the RFID reader or suppressing the returned signal from a RF illuminated RFID tag. In such cases, the impedance of the receiving antenna 30 itself can be used to absorb the extra RF energy. This is generally possible in the present example because of the relatively small amount of transmit power required in the example presented herein (e.g., a maximum of 1 Watt). For more powerful applications, a separate "dummy load" (e.g., a separate antenna or a sloping piece of lossy material at the back/bottom of the receiving portion of the waveguide) may be provided.

In some embodiments, receiving antenna 30 may be located within the transmitting portion (i.e., the cylindrical portion in the embodiment illustrated) of the waveguide 26. When such is the case, receiving antenna 30 is preferably located opposite to (i.e., 180 degrees spaced from in the case of a cylindrical waveguide) the transmitting antenna 28. In such an embodiment, receiving antenna 30 is preferably mounted the same distance C as is transmitting antenna 28 from its nearest conductive end 32 of the waveguide 26.

Electrically conductive tunnels provide an entrance 34 and an exit 36 for the continuous strip 16 of RFID tags and act to suppress and absorb any RF energy that leaks or is reflected into the tunnels 34, 36. This is due to the physical size of the tunnels being smaller that the lower frequency/longest wavelength transmitted within the waveguide. As an example, if the tunnel height E were 3.2 inches, the transmission into the tunnels 34, 36 would be attenuated by about $4 \times 10^{-5}$ across a free-space wavelength of about 13 inches. Note this suppression works both ways—the adjacent RFID tags are exposed to a lesser amount of incident RF energy. Any response created and transmitted by the RFID tags within the tunnels 34, 36 is absorbed to a similar degree. The effectiveness of this solution can be increased by mounting conductive carbon brushes at the openings, both to bleed off any static charge and to further block any incident radiation into or out of the tunnels 34, 36. The tunnel height E of entrance 34 and exit 36 tunnels may be the same, or the height of each of tunnels 34, 36 may be different.

Note that in some embodiments tunnels 34, 36 can be slid into the waveguide (as shown in FIG. 2), in order to vary the dimensions F, G of the openings therebetween masking off adjacent RFID tags on the continuous strip. This adjustment is preferred to deal with the spacing of tags on the continuous strip 16, which may not lie on 6.5 inch centers, as in this example. In an alternative embodiment, in order to improve single RFID tag reading, an electrically conducting slide 35 with a centrally located slot 37 may be introduced into the waveguide. The slot 37 is transparent to the radio waves and transversally overlays the tag carrying web. The configuration and dimensions of the slot 37 of the slide 35 (which is preferably removable and interchangeable) permits selective coupling of either electric, magnetic or electromagnetic fields of the two portions of the wave guide 26. The selected position of the slot 37 corresponds to the preferred position of the RFID tag during the "read" cycle.

A programmable RFID tag reader, which drives the quarter wavelength stub antenna, preferably has a software variable power output. It also provides a count of the RFID tags that answered a query. This can preferably be auto-tuned to reduce the output power, selecting a value of power output that provides a return of but one RFID tag. Since the configuration and operation of such RFID tag readers are known to those skilled in the art, a detailed description thereof is not presented herein.

As discussed briefly above, the system 10 of the present invention can be usefully augmented by an additional RFID reader antenna 20. This antenna 20 is placed at a typical RFID read distance; in the currently described exemplary embodiment, this is 24 inches. This additional channel of information is coupled with the individual RFID tag data determined by the narrow angle RFID tag inspection station 18; it provides a verification that a given RFID tag has sufficient power response to use in a typical end-user environment. RFID shielding is preferably employed to limit the number of RFID tag responses, so the inspection equipment does not have to traverse a large list of perceived, responding RFID tags. A sizable list would make it harder to achieve the throughput of 100% inspected RFID tags.

In one embodiment, the additional shielding comprises two parts: (1) an enclosure about the antenna open towards the RFID tag strip (which earth grounded enclosure limits the RF radiation to the sides), and (2) an earth grounded channel, with an aperture facing the antenna, of dimensions less than half the RFID inspection wavelength. The goal here is to absorb the incident radiation that might propagate within the channel by making the internal width and height smaller than the RF wavelength.

One exemplary embodiment of the earth grounded channel may be a channel 24" long by 4" wide by 2.5" high. The aperture may be cut rectangularly, facing the antenna, with dimensions of 3" long by 3" wide. A signal processor 23, such as forms part of an RFID reader and software, would see a stream of RFID tag numbers, and would match these numbers against RFID tag number obtained from the narrow angle RFID tag inspection station 18. In that fashion system 10 guarantees 100% readable RFID tags/labels for a users typical application. It should be noted that although FIG. 2 shows additional RFID reader antenna 20 being disposed upstream of the narrow angle RFID tag inspection station 18, the order thereof may be reversed.

Figure 3:
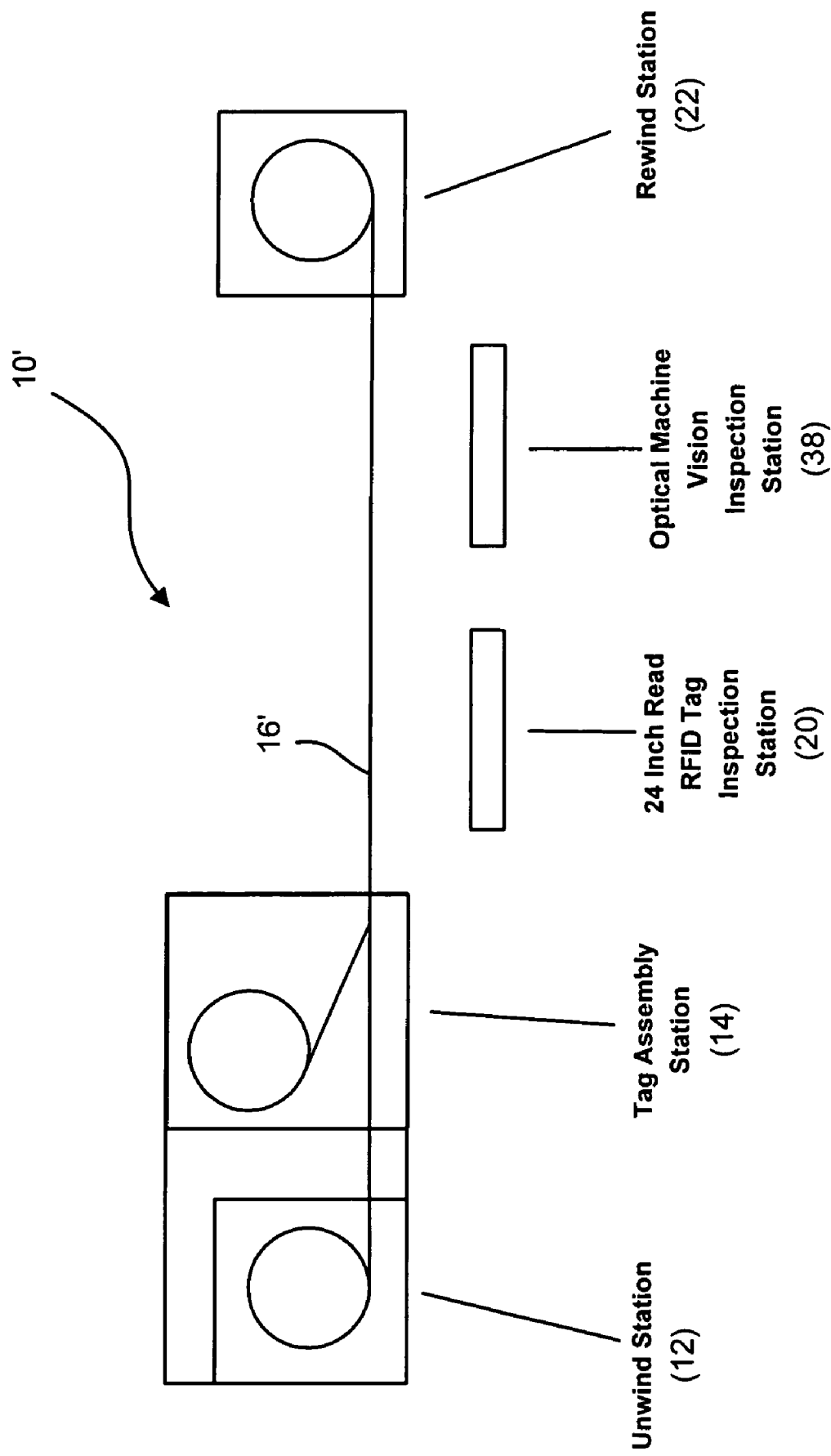
FIG. 3 schematically illustrates a complete system for validating RFID tags in accordance with another embodiment of the present invention.

In accordance with another embodiment of the present invention, as illustrated in FIG. 3, in some circumstances it may be desirable simply to verify that a label reads with a particular tag designation which has been assigned to it. For example, a user of the labels may want to verify functionality of each label as it is being affixed to a product. In such circumstances, a complex shielding arrangement may not be required. Instead, according to this embodiment of the present invention, system 10' includes two reading stations (in addition to the unwind 12, assembly 14 and rewind 22 stations as discussed above): (1) a "wide angle" relatively long range read RFID inspection station 20, and (2) an optical machine vision reading station 38. Each label 40, or preferably a backing or carrier layer 42 on which each label (most preferably having a pressure sensitive adhesive applied thereto) is carried before being affixed to the product (i.e., which forms the web 16' of labels), is printed with a machine readable indication 44 of that label's tag designation.

The "wide angle" read RFID inspection station 20 functions substantially the same as the corresponding station 20 discussed above (i.e., the one disclosed as being capable of reading labels from a distance of 24 inches). The optical machine vision reading station 38, using machine vision, reads the machine readable indication 44 of each label's tag designation. The tag designations of the labels read using the RFID inspection station 20 are compared by signal processor 23 with the designations of the labels read using the optical machine reading station 38. If the RFID inspection station 20 reads all of the same tag designations as the optical machine vision reading station 28, the functionality of the labels is verified.

Of course, as discussed above, the RFID inspection station 20, lacking specifically adapted shielding, may read several labels at once and be unable to differentiate between labels. However, this makes no difference in the context of the present invention. As long as the RFID inspection station 20 and the optical machine reading station 38 read all of the same tag designations (no matter what the order in which they are read), the labels are functioning properly. However, if the RFID inspection station 20 reads a tag designation which the optical machine reading station 38 does not, or if the optical machine reading station 38 reads a tag designation which the RFID inspection station 20 does not, one knows that a problem with the labels exists.

Figure 4:
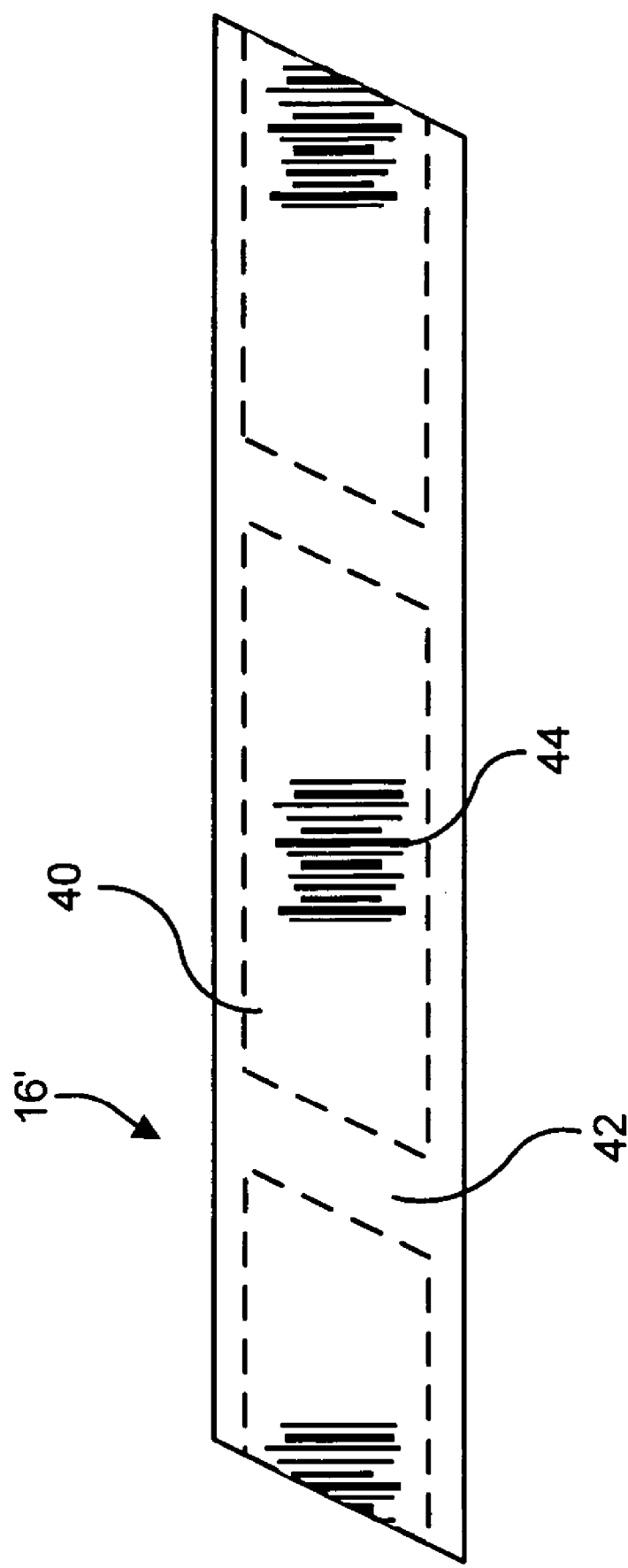
FIG. 4 is a perspective view illustrating a web of labels for use in the system of FIG. 3.

As mentioned above, and as shown in FIG. 4, it is most desirable, particularly in the case of labels which employ a pressure sensitive adhesive, for the machine readable tag designations 44 to be printed on the backing or carrier layer 42 of the labels 40. The machine readable tag designations 44 may be printed using standard alphanumeric characters, bar codes (as shown in FIG. 4), or any other similarly machine readable configuration. As machine vision and machine readable indications 44 are well known in the art, a detailed discussion is not presented herein.

The present invention, therefore, provides a system and method for validating radio frequency identification tags to ensure proper functioning thereof which is capable of ensuring that 100% (or at least very close to 100%) of the RFID labels are readable, which is capable of reading and verifying RFID labels when they are in their finished state, i.e. mounted in close proximity to one and another (e.g., inches apart) on a liner or carrier (for example a continuous web of paper of the like), which is adapted to be used in conjunction with tags having a long read range (e.g., greater than 24"), and which is capable of reading and validating labels moving at a relatively fast speed.

Operation of system 10 is now discussed in more detail. As discussed above, in certain preferred embodiments, system 10 employs two readers to read and determine if tags are readable. In certain preferred embodiments, the tags are first read by wide angle reader 20 and then by narrow angle reader 18. A data processor computer stores the electronic product code (EPC) serial numbers from the last 30 tags read by the wide angle reader 20. It should be noted that the quantity of 30 tags is determined by the size of the total number of tags that are readable by the wide angle reader 20, and the total number of tags that are not visible to the wide angle reader 20 and the narrow angle reader 18. When a valid tag is read by the narrow angle reader 18, the data processor computer checks to determine if the tag's EPC serial number was also read by the wide angle reader 20 by searching EPC serial numbers stored by the wide angle reader 20. If so, the tag is considered to be good.

As the tags are read, either by the wide angle reader 20 or by the narrow angle reader 18, raw tag data is sent out to the data processor computer for data logging purposes. The tag data is then "parsed" out into its constituent data. This data may consist of, for example, the following: EPC header (8 bits); EPC Object Type data (3 bits); EPC Partition data (3 bits); EPC Manager data (24 bits); EPC Object Class data (20 bits); and EPC Serial Number data (38 bits).

The wide angle reader 20 is preferably configured so as to limit the number of tags able to be read at any one time. The maximum number of tags read by the wide angle reader 20 is 6 tags in certain preferred embodiments.

In operation, the wide angle reader 20 is commanded to read by the data processor computer. The data processor computer then waits for a response from the wide angle reader 20, and the data processor computer inputs the tag data for one tag and parses out the data. The data processor computer then checks the EPC Manager number from the tag against the required EPC Manager number. If the EPC Manager numbers do not match, the data processor computer declares an error and stops the system 10. The data processor computer then checks the EPC Object Class data from the tag against the required EPC Object Class. If the EPC Object Classes do not match, the data processor computer declares an error and stops the system 10.

The data processor computer then checks to see if the EPC Serial Number is found within the EPC Serial Numbers stored by the wide area reader 20. If the EPC Serial Number is found in the stored data, the data processor computer then checks the next tag's data. If the EPC Serial Number is not found within the stored data, the data processor computer replaces the oldest EPC Serial Number with the current EPC Serial Number. In this manner, the data processor computer produces a database of the last 30 tags read.

The data processor computer also commands the narrow angle tag reader 18 to read a tag whenever a tag is within the read window of the narrow angle tag reader 18. The data processor computer then waits for a response from the narrow angle tag reader 18. If the narrow angle tag reader 18 returns valid tag data, the data processor computer parses out the tag data, checks the EPC Manager number and EPC Object Class against the required EPC Manager number and EPC Object Class to make sure that the tag is valid. If the tag is not valid, the data processor computer declares an error and stops the system 10.

If the EPC Manager number and the EPC Object Class are valid, the data processor computer then compares the EPC Serial Number with the EPC Serial Numbers stored in the database by the wide angle reader 20. If the EPC Serial Number is found in the database, it means that the tag was readable by both the wide angle reader 20 and the narrow angle reader 18, and the tag is therefore declared good. If the EPC Serial Number is not found in the database, it means that the tag was readable by the narrow angle tag reader 18, but not by the wide angle reader 20, and the tag is therefore declared bad. If the narrow angle tag reader 18 returns no valid tag data, it means that the tag was not readable by the narrow angle tag reader 18, and the tag if therefore declared bad.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A system for validating each of a plurality of radio frequency identification tags disposed on a web in close proximity to one another to ensure proper functioning thereof, said system comprising:
    a narrow angle radio frequency identification tag reading station which reads a designation of each radio frequency identification tag individually in order to generate a first list of tag designations read thereby;
    a wide angle radio frequency identification tag reading station which reads designations of a plurality of radio frequency identification tags simultaneously from a long range in order to generate a second list of tag designations read thereby; and
    a processor which compares the first list of tag designations with the second list of tag designations and evaluates the functionality of the plurality of radio frequency identification tags based at least in part upon the comparison.

2. The system of claim 1 wherein said narrow angle radio frequency identification tag reading station comprises a shielding structure of conductive material which is built as a waveguide to structure and contain illumination of radio frequency energy so only a single tag is energized and actuated at a time.

3. The system of claim 2 wherein said narrow angle radio frequency identification tag reading station further comprises a transmitting antenna for introducing radio frequency energy into the waveguide.

4. The system of claim 3 wherein the transmitting antenna comprises a quarter wavelength long, unity gain, stub antenna.

5. The system of claim 4 wherein a length of the transmitting antenna is calculated to be resonant to an average frequency of a range used.

6. The system of claim 3 wherein the transmitting antenna comprises a thick stub antenna so as to spread out the selectivity of the antenna to accommodate the range of frequencies and wavelengths used.

7. The system of claim 6 wherein the transmitting antenna has a thickness of about ⅛ inch.

8. The system of claim 7 wherein a length of the transmitting antenna is calculated to be resonant to an average frequency of a range used less about 5%.

9. The system of claim 3 wherein the transmitting antenna is disposed parallel to a dipole antenna of the radio frequency identification tags.

10. The system of claim 3 wherein said narrow angle radio frequency identification tag reading station further comprises a receiving antenna which receives signals transmitted by the transmitting antenna.

11. The system of claim 10 wherein the receiving antenna further absorbs unused radio frequency illumination, thereby suppressing reflections back up the waveguide.

12. The system of claim 10 wherein the receiving antenna comprises a quarter wavelength long, unity gain, stub antenna.

13. The system of claim 12 wherein a length of the receiving antenna is calculated to be resonant to an average frequency of a range used.

14. The system of claim 12 wherein the receiving antenna comprises a thick stub antenna so as to spread out the selectivity of the antenna to accommodate the range of frequencies and wavelengths used.

15. The system of claim 14 wherein the receiving antenna has a thickness of about ⅛ inch.

16. The system of claim 15 wherein a length of the receiving antenna is calculated to be resonant to an average frequency of a range used less about 5%.

17. The system of claim 12 wherein the receiving antenna is disposed parallel to a dipole antenna of the radio frequency identification tags.

18. The system of claim 2 wherein said narrow angle radio frequency identification tag reading station further comprises electrically conductive tunnels provided at an entrance and an exit for the web of radio frequency identification tags, which tunnels act to suppress and absorb any radio frequency energy that leaks into or is reflected into the tunnels.

19. The system of claim 18 wherein the tunnels are slideable toward and away from each other into the waveguide in order to vary dimensions of an opening therebetween masking off adjacent radio frequency identification tags on the web so as to accommodate tags having various spacings on the web.

20. The system of claim 18 further comprising an electrically conducting slide having a slot introduced into the waveguide, the slot being transparent to the radio waves and transversally overlaying the web of radio frequency identification tags.

21. The system of claim 1 wherein said narrow angle radio frequency identification tag reading station comprises an optical machine vision reading station and wherein each tag has associated therewith a machine vision readable indication of that tag's designation.

22. The system of claim 21 wherein the machine vision readable indication is printed on a backing or carrier layer on which each tag is carried.

23. The system of claim 1 wherein the wide angle radio frequency identification tag reading station reads tags from a distance at least as far as the tags are to be used in practice.

24. The system of claim 23 wherein the wide angle radio frequency identification tag reading station reads tags from a distance of at least 24 inches.

25. A system for validating each of a plurality of radio frequency identification tags disposed on a web in close proximity to one another to ensure proper functioning thereof, said system comprising:
  a narrow angle radio frequency identification tag reading station which reads a designation of each radio frequency identification tag individually in order to generate a first list of tag designations read thereby, said radio frequency identification tag reading station comprising:
  a shielding structure of conductive material which is built as a waveguide to structure and contain illumination of radio frequency energy so only a single tag is energized and actuated at a time;
  a transmitting antenna disposed parallel to a dipole antenna of the radio frequency identification tags for introducing radio frequency energy into the waveguide;
  a receiving antenna which receives signals transmitted by the transmitting antenna; and
  electrically conductive tunnels provided at an entrance and an exit for the web of radio frequency identification tags, which tunnels act to suppress and absorb any radio frequency energy that leaks into or is reflected into the tunnels;
  a wide angle radio frequency identification tag reading station which reads designations of a plurality of radio frequency identification tags simultaneously from a long range in order to generate a second list of tag designations read thereby; and
  a processor which compares the first list of tag designations with the second list of tag designations and evaluates the functionality of the plurality of radio frequency identification tags based at least in part upon the comparison.

26. The system of claim 25 wherein the receiving antenna further absorbs unused radio frequency illumination, thereby suppressing reflections back up the waveguide.

27. The system of claim 25 wherein the transmitting antenna comprises a quarter wavelength long, unity gain, stub antenna.

28. The system of claim 27 wherein a length of the transmitting antenna is calculated to be resonant to an average frequency of a range used.

29. The system of claim 27 wherein the transmitting antenna comprises a thick stub antenna so as to spread out the selectivity of the antenna to accommodate the range of frequencies and wavelengths used.

30. The system of claim 29 wherein the transmitting antenna has a thickness of about ⅛ inch.

31. The system of claim 30 wherein a length of the transmitting antenna is calculated to be resonant to an average frequency of a range used less about 5%.

32. The system of claim 25 wherein the receiving antenna comprises a quarter wavelength long, unity gain, stub antenna.

33. The system of claim 32 wherein a length of the receiving antenna is calculated to be resonant to an average frequency of a range used.

34. The system of claim 32 wherein the receiving antenna comprises a thick stub antenna so as to spread out the selectivity of the antenna to accommodate the range of frequencies and wavelengths used.

35. The system of claim 34 wherein the receiving antenna has a thickness of about ⅛ inch.

36. The system of claim 35 wherein a length of the receiving antenna is calculated to be resonant to an average frequency of a range used less about 5%.

37. The system of claim 32 wherein the receiving antenna is disposed parallel to a dipole antenna of the radio frequency identification tags.

38. The system of claim 25 wherein the tunnels are slideable toward and away from each other into the waveguide in order to vary dimensions of an opening therebetween masking off adjacent radio frequency identification tags on the web so as to accommodate tags having various spacings on the web.

39. The system of claim 25 further comprising an electrically conducting slide having a slot introduced into the waveguide, the slot being transparent to the radio waves and transversally overlaying the web of radio frequency identification tags.

40. The system of claim 25 wherein the wide angle radio frequency identification tag reading station reads tags from a distance at least as far as the tags are to be used in practice.

41. The system of claim 40 wherein the wide angle radio frequency identification tag reading station reads tags from a distance of at least 24 inches.

42. A system for validating each of a plurality of radio frequency identification tags disposed on a web in close proximity to one another to ensure proper functioning thereof, said system comprising:
  a narrow angle radio frequency identification tag reading station which reads a designation of each radio frequency identification tag individually in order to generate a first list of tag designations read thereby, said radio frequency identification tag reading station comprising an optical machine vision reading station and wherein each tag has associated therewith a machine vision readable indication of that tag's designation;
  a wide angle radio frequency identification tag reading station which reads designations of a plurality of radio frequency identification tags simultaneously from a long range in order to generate a second list of tag designations read thereby; and
  a processor which compares the first list of tag designations with the second list of tag designations and evaluates the functionality of the plurality of radio frequency identification tags based at least in part upon the comparison.

43. The system of claim 42 wherein the machine vision readable indication is printed on a backing or carrier layer on which each tag is carried.

44. The system of claim 42 wherein the wide angle radio frequency identification tag reading station reads tags from a distance at least as far as the tags are to be used in practice.

45. The system of claim 44 wherein the wide angle radio frequency identification tag reading station reads tags from a distance of at least 24 inches.

46. A method for validating each of a plurality of radio frequency identification tags disposed on a web in close proximity to one another to ensure proper functioning thereof, said method comprising the steps of:

reading a designation of each radio frequency identification tag individually in order to generate a first list of tag designations at a narrow angle radio frequency identification tag reading station;

reading designations of a plurality of radio frequency identification tags simultaneously from a long range in order to generate a second list of tag designations at a wide angle radio frequency identification tag reading station; and comparing the first list of tag designations with the second list of tag designations and evaluating the functionality of the plurality of radio frequency identification tags based at least in part upon the comparison.

* * * * *